United States Patent [19]

Senn

[11] Patent Number: 4,720,606

[45] Date of Patent: Jan. 19, 1988

[54] SEAL IN HOUSING MEANS CONTAINING ELECTRICAL APPARATUSES

[76] Inventor: Jakob Senn, Via Barazzo, CH-6596 Gordola, Switzerland

[21] Appl. No.: 877,928

[22] Filed: Jun. 24, 1986

[30] Foreign Application Priority Data

Jun. 28, 1985 [CH] Switzerland .................. 2748/85

[51] Int. Cl.⁴ .............................................. H05K 9/00
[52] U.S. Cl. ................................................ 174/35 GC
[58] Field of Search ................................... 174/35 GC

[56] References Cited

U.S. PATENT DOCUMENTS

| | | | |
|---|---|---|---|
| 2,454,567 | 11/1948 | Pierson, Jr. ............... | 174/35 GC |
| 2,974,183 | 3/1961 | Kes et al. .................. | 174/35 GC |
| 3,126,440 | 3/1964 | Goodloe ..................... | 174/35 GC |
| 3,969,572 | 7/1976 | Rostek ....................... | 174/35 GC X |
| 4,098,633 | 7/1978 | Kersten ..................... | 174/35 GC X |

*Primary Examiner*—Arthur T. Grimley
*Assistant Examiner*—David A. Tone
*Attorney, Agent, or Firm*—Pollock, Vande Sande & Priddy

[57] ABSTRACT

In a housing-like structure which contains electrical apparatuses, a resilient, profile-like sealing element (3) and a shielding element (6) are combined to form a flexible profile (5) in order to seal the adjacent surfaces of components (1, 4) against foreign substances and at the same time to prevent high-frequency or electromagnetic fields and radiation from passing in or out. The sealing element (3) can contain a strip-like, resilient core (7) which is provided with an envelope (8) as thin as a film and consisting of electrically conductive material.

8 Claims, 5 Drawing Figures

SEAL IN HOUSING MEANS CONTAINING ELECTRICAL APPARATUSES

BACKGROUND OF THE INVENTION

Seals which are made of resilient material and make it more difficult for gases, liquids and foreign substances to gain access through joints and intermediate spaces of adjacent parts are known in various embodiments. They generally fulfill their intended purpose satisfactorily.

SUMMARY OF THE INVENTION

The present invention relates to a seal in housing means containing electrical apparatuses. It is an object of the present invention to provide a seal which is tight to gases, air, dust and other foreign substances and at the same time to provide a shield against electromagnetic fields. A further object of the present invention is to provide an embodiment which can be produced economically with simple means.

The invention is illustrated below by embodiments, with reference to the drawing, in which

DESCRIPTION OF THE PREFERRED EMBODIMENT

Figure 1:
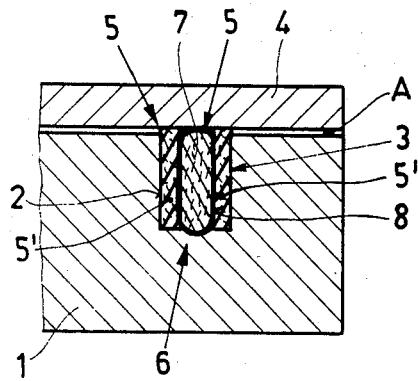
FIG. 1 shows a vertical section through the of a first embodiment, seal in a groove for two components lying flat against each other.

In FIG. 1 number 1 denotes a component, a housing or a cabinet panel of an electrical control apparatus. The component 1 includes a conventional groove 2, in which sealing element 3 is mounted. Component 4 lies on top of component 1 and sealing element 3. Component 4 is, for example, the cabinet panel of a control device or the wall of a computer housing. Sealing element 3 is formed by an elongated profile 5 made of resilient material, such as foamed plastic with open or closed pores. A shielding element 6 which resembles a hollow body, is located inside the profile 5, passes transversely through the latter and contains a band-like core 7 which is made of resilient material, such as foamed plastic or the like, and is enclosed in an envelope 8 which is as thin as a film and consists of an electrically conductive material. The inside of the envelope 8 is frictionally bonded to the surface of the core 7 by an organic or inorganic adhesive and a permanent surface bond. The opposite vertical sides of the envelope 8 are adhesively bonded to the profile parts 5'. The modulus of elasticity of the material of core 7 and that of the profile 5 formed by profile parts 5' can be identical or different. Furthermore, it is possible for the material of profile parts 5' to be flexible and resilient and for that of core 7 to be tough and resilient. The size of the sealing element 3 depends on the form of the housing means; if the latter contains one or more electrical apparatuses involving high frequencies or electromagnetic oscillations, a preferable width is about 8-12 mm and a preferable height about 10-14 mm.

If sealing element 3 is exposed to moisture, either through gases or liquid media, the profile parts 5' advantageously consist of a foamed plastic having closed pores. Where the surfaces of profile 5 are in danger of being damaged by physical or chemical processes, it is pertinent for a suitable protective layer of conventional materials to be mounted or applied by adhesive bonding.

The upper and lower surfaces of the envelope 8 containing the core 7 project slightly beyond the profile parts 5' and are exposed, providing shielding against radiation and frequency waves entering through the gap A between components 1 and 4.

Figure 2:
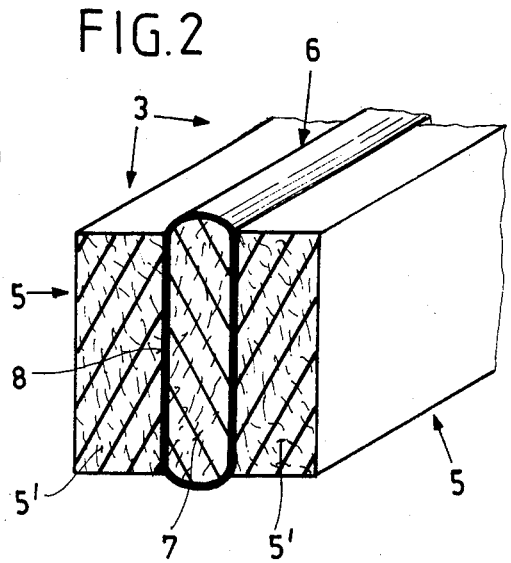
FIG. 2 shows a vertical section through the seal alone, on a larger scale.
Figure 3:
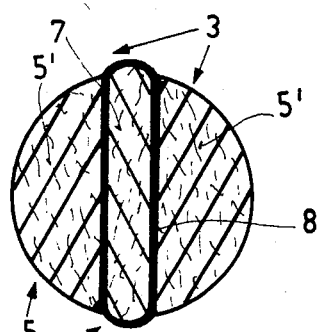
FIG. 3 shows a vertical section through a second embodiment of the sealing element

In the second embodiment according to FIG. 3, the sealing element 3 has a circular cross-section. In cross-section, the profile parts 5' have the shape of circular sections, and their chords are adhesively bonded to the envelope 8 forming the shielding element 6, similarly to FIGS. 1 and 2.

Figure 4:
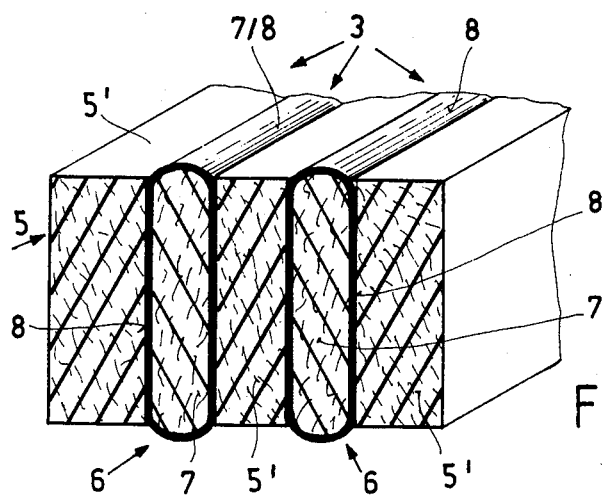
FIG. 4 shows the same vertical section for a third embodiment.

FIG. 4 shows a sealing element including two shielding elements 6 which are arranged alongside one another and a distance apart and are connected to three associated profile parts 5'.

Figure 5:
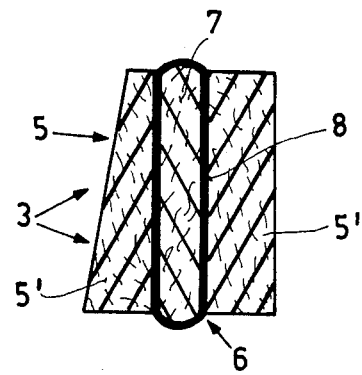
FIG. 5 shows a further vertical section for a fourth embodiment.

FIG. 5 shows a sealing element which has the shape of a truncated pyramid when viewed in cross-section. The components denoted by reference symbols have the same meanings as in FIGS. 1 and 2.

The sealing element 3 is covered in suitable areas with conventional self-adhesive material, which is not indicated specially.

The electrically conductive envelope 8 can be advantageously made of aluminum, copper, nickel silver, an electrically conductive alloy, etc.

The method of production is simple; a film web whose width corresponds to the extent of the core should be wound around the preproduced strip-like core 7, after which the adhesive bond should be produced by pressing. The surfaces of the core 7 and of the envelope 8 which come into contact with one another can be provided with dry adhesive in a prior production stage. It is of course also possible for the adhesive to be sprayed on during the production process. When it consists of expensive electrically conductive material, such as nickel silver or the like, the envelope 8 may furthermore have the structure of a net, a screen or a cage, in order to save material.

I claim:

1. A sealing device for sealing two components of a housing means for electrical apparatus to effectively prevent entry of gas, air, and moisture and for shielding against electromagnetic fields comprising:
   a first outer, elongated member made of a resilient material said first member including upper and lower surfaces; and
   a second inner member having a band-like core made of a resilient material and a thin-film envelope of an electrically conductive material surrounding said core, said second member being inserted into said first member, said second member having top and bottom ends projecting beyond said upper and lower surfaces of said first member.

2. A sealing device as claimed in claim 1, wherein said core and said envelope are adhesively bonded to one another.

3. A sealing device as claimed in claim 2, wherein said outer member includes two profile parts which are located on two opposite sides of said envelope of said inner member.

4. A sealing device as claimed in claim 3, wherein said core and said outer member are made of a flexible, resilient or a tough, resilient foamed plastic.

5. A sealing device as claimed in claim 4, wherein a plurality of inner members are arranged side by side, a distance apart, in said outer member.

6. A sealing device as claimed in claim 5, wherein the inner surface of said outer member and outer surface of said envelope are frictionally bonded.

7. A sealing device as claimed in claim 6, wherein the modulus of elasticity of said outer member and said core are identical.

8. A sealing device as claimed in claim 6, wherein the modulus of elasticity of said outer member and said core are different.

* * * * *